(12) United States Patent
Beltran Lizarraga

(10) Patent No.: US 9,705,453 B2
(45) Date of Patent: Jul. 11, 2017

(54) CIRCUITS AND DEVICES RELATED TO MULTI-HARMONIC CONTROL OF AMPLIFIED SIGNALS

(71) Applicant: SKYWORKS SOLUTIONS, INC., Woburn, MA (US)

(72) Inventor: Ramon Antonio Beltran Lizarraga, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/237,453

(22) Filed: Aug. 15, 2016

(65) Prior Publication Data

US 2017/0040961 A1 Feb. 9, 2017

Related U.S. Application Data

(63) Continuation of application No. 14/291,810, filed on May 30, 2014, now Pat. No. 9,419,568.

(Continued)

(51) Int. Cl.
*H04B 1/40* (2015.01)
*H03F 3/217* (2006.01)
(Continued)

(52) U.S. Cl.
CPC ........... *H03F 3/2176* (2013.01); *H03F 1/565* (2013.01); *H03F 3/193* (2013.01); *H04B 1/40* (2013.01);
(Continued)

(58) Field of Classification Search
CPC .......... H03F 3/2176; H03F 1/565; H04B 1/40
(Continued)

(56) References Cited

U.S. PATENT DOCUMENTS 2,035,258 A 3/1936 Bode
4,717,884 A * 1/1988 Mitzlaff .................. H03F 3/217
330/251

(Continued)

FOREIGN PATENT DOCUMENTS

CN 201410451999.1 6/2014
KR 10-2014-67926 6/2014

OTHER PUBLICATIONS

F. H. Raab, "Idealized operation of the class E tuned power amplifier," IEEE Trans. Circuits Syst., vol. CAS-24, Dec. 1977, pp. 725-735.

(Continued)

*Primary Examiner* — Patricia T Nguyen
(74) *Attorney, Agent, or Firm* — Chang & Hale LLP

(57) ABSTRACT

Circuits and devices related to multi-harmonic control of amplified signals. In some embodiments, an amplifier circuit assembly can include an amplifier configured to provide a signal at an output. The amplifier circuit assembly can further include a matching network configured to provide impedance matching for the signal having a fundamental frequency, a broadband harmonic trap configured to substantially trap a plurality of harmonics associated with the fundamental frequency, and a dipole network configured to tune reactances associated with the broadband harmonic trap. The matching network, the broadband harmonic trap and the dipole network can be implemented in series from the output of the amplifier.

20 Claims, 7 Drawing Sheets

Related U.S. Application Data

(60) Provisional application No. 61/830,596, filed on Jun. 3, 2013.

(51) Int. Cl.
*H03F 1/56* (2006.01)
*H03F 3/193* (2006.01)

(52) U.S. Cl.
CPC .. *H03F 2200/423* (2013.01); *H03F 2200/451* (2013.01)

(58) Field of Classification Search
USPC .......................................................... 330/302
See application file for complete search history.

(56) References Cited

U.S. PATENT DOCUMENTS

| | | | |
|---|---|---|---|
| 5,939,941 A | 8/1999 | Nair | |
| 6,236,274 B1 | 5/2001 | Liu | |
| 8,164,387 B1 | 4/2012 | Apel et al. | |
| 9,419,568 B2 | 8/2016 | Beltran Lizarraga | |
| 2002/0105384 A1 | 8/2002 | Dent | |
| 2005/0007194 A1* | 1/2005 | Grundlingh | H03F 1/0294 330/251 |
| 2005/0104679 A1 | 5/2005 | Blednov | |
| 2007/0024374 A1 | 2/2007 | Blair et al. | |
| 2008/0094142 A1* | 4/2008 | Kawashima | H03F 3/189 330/296 |
| 2010/0079211 A1* | 4/2010 | Matsuda | H03F 1/565 330/306 |
| 2011/0003566 A1* | 1/2011 | Makihara | H01Q 23/00 455/127.1 |
| 2013/0331048 A1* | 12/2013 | Tombak | H03F 3/45076 455/127.2 |
| 2014/0002188 A1* | 1/2014 | Chen | H03F 3/19 330/250 |
| 2016/0294333 A1* | 10/2016 | Feng | H03F 3/217 |

OTHER PUBLICATIONS

R. Beltran and F.H. Raab, "Lumped-element Output Networks for High-efficiency Power Amplifiers," MTT Int. Microwave Symposium Anaheim, CA, May 23-28, 2010.

A. V. Grebennikov, "Load network design for high-efficiency class-F power amplifiers," IEEE MTT-S Int. Microwave Symp. Dig., vol. 2, Jun. 13-15, 2000, pp. 771-774, Boston, MA.

F. H. Raab, "Class-E -C and F power amplifiers based upon a finite number of harmonics," IEEE Trans. Microwave Theory Tech., vol. 49, No. 8, Aug. 2001, pp. 1462-1468.

C. Tang, et. al, "A Microstrip Ultra-Wideband Bandpass Filter With Cascaded Broadband Bandpass and Bandstop Filters," IEEE Trans. Microwave Theory Tech, vol. 55, No. 11, Nov. 2007, pp. 2412-2418.

\* cited by examiner

CIRCUITS AND DEVICES RELATED TO MULTI-HARMONIC CONTROL OF AMPLIFIED SIGNALS

CROSS-REFERENCE TO RELATED APPLICATIONS

This application is a continuation of U.S. application Ser. No. 14/291,810 filed May 30, 2014, entitled CIRCUITS AND METHODS RELATED TO POWER AMPLIFIER EFFICIENCY BASED ON MULTI-HARMONIC APPROXIMATION, which claims priority to and the benefit of the filing date of U.S. Provisional Application No. 61/830,596 filed Jun. 3, 2013, entitled CIRCUITS AND METHODS RELATED TO POWER AMPLIFIER EFFICIENCY BASED ON MULTI-HARMONIC APPROXIMATION, the benefits of the filing dates of which are hereby claimed and the disclosures of which are hereby expressly incorporated by reference herein in their entirety.

BACKGROUND

Field

The present disclosure generally relates to radio-frequency (RF) technology, and more particularly, to circuits and methods related to power amplifier efficiency based on multi-harmonic approximation.

Description of the Related Art

Efficiency of power amplifiers (PAs) is an important concern in wireless communication systems such as cellular phones and base stations, since such efficiency can impact operating factors such as battery life, heat dissipation and cost. Different PA classes of operation can lead to high-efficiency and output power capabilities. For example, an ideal class-E PA can achieve an efficiency that is close to 100%. However, at high frequencies, class-E PA operation is typically limited by device drain parasitics. Accordingly, true-transient operation is generally not possible.

SUMMARY

In some implementations, the present disclosure relates to an output network circuit for multi-harmonic control of a radio-frequency (RF) power amplifier. The output network circuit includes an impedance matching network configured for a fundamental frequency ($f_0$) of the power amplifier. The output network circuit further includes a broadband harmonic trap in communication with the impedance matching network. The broadband harmonic trap is configured to substantially trap a plurality of harmonics associated with the fundamental frequency. The output network circuit further includes a dipole network in communication with the broadband harmonic trap. The dipole network is configured to tune reactances resulting from the operation of the broadband harmonic trap.

In some embodiments, the power amplifier can be a class-E power amplifier. The class-E power amplifier can include a drain node of an amplifying transistor, such that an input of the dipole network is coupled to the drain node. An input of the broadband harmonic trap can be coupled to an output of the dipole network. An input of the impedance matching network can be coupled to an output of the broadband harmonic trap.

In some embodiments, the dipole network can include a parallel combination of a first path and a second path, with the first path including a capacitance, and the second path including an inductance. The first path of the dipole network can further include an inductance in series with the capacitance. The second path of the dipole network can further include a capacitance in series with the inductance.

In some embodiments, the second path of the dipole network can further include a capacitance in series with the inductance. In some embodiments, the dipole network can further include a capacitance or an inductance in series with the parallel combination of the first path and the second path.

In some embodiments, the broadband harmonic trap can include a parallel combination of a bandpass network and a lowpass network. The bandpass network can include a first inductance, a second inductance, a first capacitance, and a second capacitance connected in series, with a capacitive coupling from a node between the first and second inductances to ground through a third capacitance, and an inductive coupling from a node between the first and second capacitances to ground through a third inductance. The lowpass network can include a third inductance, a fourth inductance, and a fifth inductance connected in series, with a capacitive coupling from a node between the third and fourth inductances to ground through a fifth capacitance, and a capacitive coupling from a node between the fourth and fifth inductances to ground through a sixth capacitance.

In some embodiments, the impedance matching network can include a T-network having first and second inductances connected in series and a capacitance that couples a node between the first and second inductances with ground.

In some embodiments, the broadband harmonic trap and the dipole network can be configured to present desired impedance and reactance for a number of multiple harmonics. The multiple harmonics include frequencies that are $2f_0$ or higher. The multiple harmonics include $2f_0$ to $10f_0$. The broadband harmonic trap can be configured to suppress $2f_0$, $3f_0$, and $4f_0$.

In some embodiments, the dipole network can be configured to adjust harmonic reactances shorted by the broadband harmonic trap.

In accordance with a number of implementations, the present disclosure relates to a class-E power amplifier that includes an amplification stage having an input and an output. The amplification stage is configured to receive and amplify a radio-frequency (RF) signal. The class-E power amplifier further includes an output network circuit coupled to the output of the amplification stage. The output network circuit includes an impedance matching network configured for a fundamental frequency of the amplification stage. The output network circuit further includes a broadband harmonic trap in communication with the impedance matching network. The broadband harmonic trap is configured to substantially trap a plurality of harmonics associated with the fundamental frequency. The output network circuit further includes a dipole network in communication with the broadband harmonic trap. The dipole network is configured to tune reactances resulting from the operation of the broadband harmonic trap.

In a number of teachings, the present disclosure relates to a method for processing an amplified radio-frequency (RF) signal. The method includes impedance matching for a fundamental frequency of the amplified RF signal. The method further includes trapping a plurality of harmonics associated with the fundamental frequency. The method further includes tuning reactances resulting from the trapping of the plurality of harmonics.

According to some implementations, the present disclosure relates to a power amplifier module that includes a packaging substrate configured to receive a plurality of components. The power amplifier module further includes a power amplifier circuit implemented on the packaging substrate. The power amplifier circuit includes an amplification stage having an input and an output, with the amplification stage being configured to receive and amplify a radio-frequency (RF) signal. The power amplifier circuit further includes an output network circuit coupled to the output of the amplification stage. The output network circuit includes an impedance matching network configured for a fundamental frequency of the amplification stage. The output network circuit further includes a broadband harmonic trap in communication with the impedance matching network. The broadband harmonic trap is configured to substantially trap a plurality of harmonics associated with the fundamental frequency. The output network circuit further includes a dipole network in communication with the broadband harmonic trap. The dipole network is configured to tune reactances resulting from the operation of the broadband harmonic trap.

In some embodiments, the amplification stage can be implemented on a semiconductor die. In some embodiments, at least some of the output network circuit can be implemented on the semiconductor die. In some embodiments, at least some of the output network circuit can be implemented on or within the packaging substrate.

According to a number of implementations, the present disclosure relates to a radio-frequency (RF) system. The RF system includes a transmitter, and a power amplifier in communication with the transmitter. The power amplifier is configured to amplify an RF signal generated by the transmitter. The RF system further includes an output network in communication with the power amplifier. The output network includes an impedance matching network configured for a fundamental frequency of the amplification stage. The output network further includes a broadband harmonic trap in communication with the impedance matching network. The broadband harmonic trap is configured to substantially trap a plurality of harmonics associated with the fundamental frequency. The output network further includes a dipole network in communication with the broadband harmonic trap. The dipole network is configured to tune reactances resulting from the operation of the broadband harmonic trap. The RF system further includes an antenna in communication with the output network. The antenna is configured to facilitate transmission of the amplified RF signal.

In some embodiments, the RF system can be part of a base station. In some embodiments, the RF system can be implemented in a wireless device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

At high frequencies, operation of some radio-frequency (RF) power amplifiers such as class-E power amplifiers can be limited by device drain parasitics so that true-transient operation is typically not possible. Hence, harmonic approximation can be used based upon the second and/or the third harmonic control using either transmission-line or lumped-element resonators. A class-E amplifier having one or more features as described herein can be configured to utilize a multi-harmonic network to control the device reactances at intrinsic drain up to, for example, ten harmonics. Although described in the context of class-E amplifiers, it will be understood that one or more features of the present disclosure can also be implemented in other types of power amplifiers.

Efficiency enhancement for power amplifiers (PAs) can be an important concern in wireless communication systems such as cellular phones and base stations because of, for example, battery life, heat dissipation and/or operating cost. Different PA classes of operation can lead to high-efficiency and output power capabilities. For example, a class-E PA can achieve approximately or close to 100% efficiency in some situations.

Figure 1A:
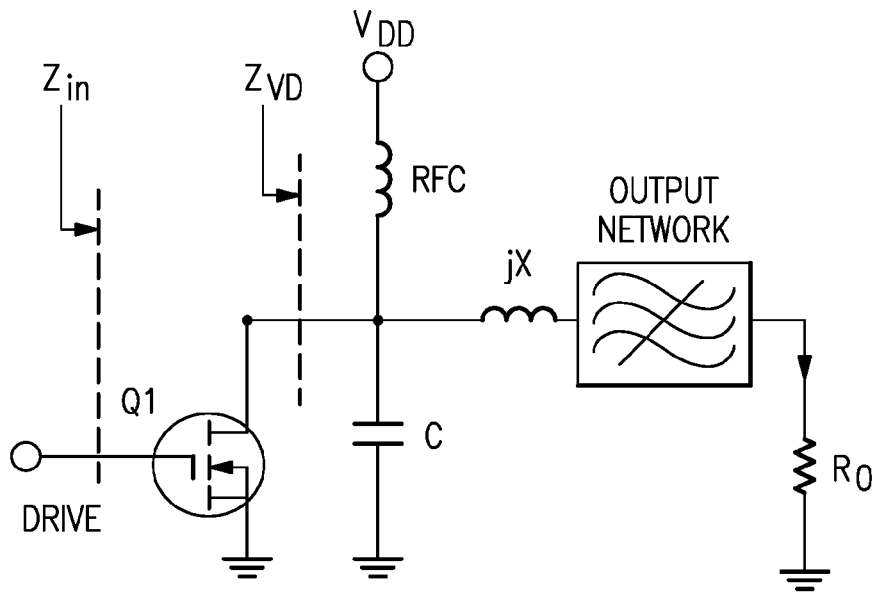
FIG. 1A shows an example of an ideal class-E power amplifier (PA) for radio-frequency (RF) applications.

FIG. 1A shows an example of an ideal class-E power amplifier (PA) for radio-frequency (RF) applications. In the example, an input RF signal is shown to be provided to the gate of an amplifying transistor Q1, and the amplified signal is shown to be output through the drain of Q1. The source of Q1 is shown to be coupled to ground. The amplified output signal is shown to be passed through an inductance providing reactance X for impedance, and an output matching network. The drain of Q1 is shown to be coupled to ground through capacitance. The drain of Q1 is also shown to be provided with a supply voltage $V_{DD}$ through a choke RFC. Accordingly, the input of Q1 presents an impedance of $Z_{in}$, and the portion of the PA circuit downstream of the drain of Q1 presents an impedance of $Z_{VD}$.

Optimum true-transient operation in such an ideal class-E PA typically requires a specific drain capacitance and series inductance at the fundamental-frequency ($f_0$), so that the transistor acts as a switch. At high-frequencies, drain parasitics can inhibit true-transient operation, and harmonic approximation can be implemented to yield a tuned class-E PA.

Figure 1B:
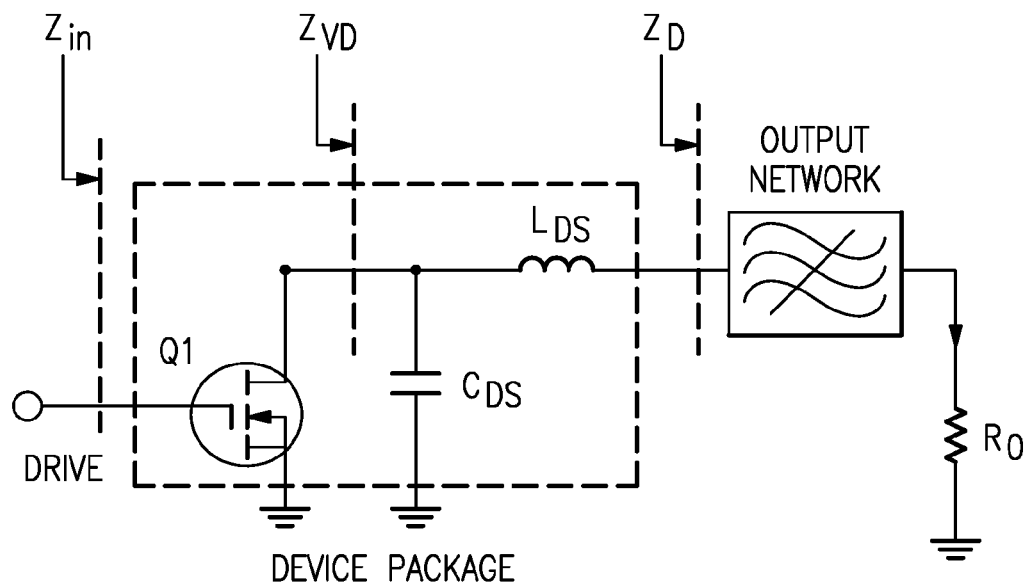
FIG. 1B shows an example of a tuned class-E PA.

FIG. 1B shows an example of such a tuned class-E PA. In FIG. 1B, the drain capacitance (C in FIG. 1A) and the series inductance (jX in FIG. 1A) are shown to have values $C_{DS}$ and $L_{DS}$, respectively, to provide such a tuned class-E configuration. Conventionally, only one or two harmonics are controlled at a time. For example, controlling of the second harmonic yields a class-$E_2$ configuration. Controlling of both of the second and third harmonics yields a class-$F_{2,3}$ configuration.

In some implementations, the maximum theoretical efficiency that can be achieved for a class-$E_2$ PA is 70.7%, and 81.65% for a class-$F_{2,3}$ PA when using an ideal device as described in F. H. Raab, "Class-E -C and F power amplifiers based upon a finite number of harmonics", IEEE Trans. Microwave Theory Tech., vol. 49, no. 8, pp. 146-1468, Aug. 2001. It is assumed that such PAs have the required impedances at each harmonic and $f_0$ at "virtual drain" ($Z_{VD}$) as shown in FIG. 1. Even though the PA efficiency enhancement using the second harmonic only can be beneficial, one can achieve higher efficiencies by increasing the number of controlled harmonics for some power amplifiers such as a high-frequency class-E amplifier. Harmonic resonators and impedance-adjustment networks can be utilized to present a required or desired reactance at $Z_{VD}$ at a given harmonic, whereas, an additional network can present a required or desired impedance at $f_0$.

Typically, such networks can be based upon transmission-line stubs or LC resonators that have an inherent narrowband feature which makes them sensitive to electrical-length or component values variation, and thereby requiring precise tuning.

Described herein are examples related to a design technique of a multi-harmonic approximation to class-E PA operation based upon drain impedances computed from classic equations (e.g, as described in F. H. Raab, "Idealized operation of the class E tuned power amplifier," IEEE Trans. Circuits Syst., vol. CAS-24, pp. 725-735, December 1977). In some implementations, a broadband harmonic trap can effectively suppress up to the fourth harmonic. Nevertheless, and by way of an example, computer simulations show that for fifth to tenth harmonics, the suppression is not even leading to a suboptimal negative reactance magnitude at $Z_{VD}$. In general, the drain waveform shapes typically resemble those of an ideal class-E PA, and the simulated peak drain efficiency is, for example, approximately 90% at 11.58-W output power for an ideal device at $f_0$=400 MHz.

True-Transient and $2^{nd}$ Harmonic Class-E PA

In order to contrast the benefits of a multi-harmonic network, a design of a classic (e.g., F. H. Raab, "Idealized operation of the class E tuned power amplifier," IEEE Trans. Circuits Syst., vol. CAS-24, pp. 725-735, December 1977) and a second-harmonic class-E PA (e.g., R. Beltran and F. H. Raab, "Lumped-element Output Networks for High-efficiency Power Amplifiers," MTT Int. Microwave Symposium Anaheim, Calif., May 23-28, 2010) can be compared. For the purpose of description, a selected device for all designs is an RF3931 GaN FET, and a target output power is approximately 11.5 W with a supply voltage ($V_{DD}$) of approximately 15 V which typically ensures safe device operation.

True-transient Class-E PA (Classic Design): A true class-E PA (e.g., as in FIG. 1) with the example 11.5 W output power and effective supply voltage $V_{eff}$=14.13 V ($R_N\sim0.45\Omega$) typically requires a shunt drain susceptance of $B_S$=0.1836/$R_0$, which represents a 7.3 pF capacitance at 400 MHz for optimum operation. For the example GaN FET, there is a parasitic shunt capacitance of approximately 17 pF at 15 V $V_{DD}$; hence, true-transient operation is not possible.

Second-harmonic Tuned Class-E PA (Class-$E_2$): Optimum impedances at the device intrinsic drain ($Z_{VD}$) of a class-$E_2$ PA can be obtained by techniques described in, for example, R. Beltran and F. H. Raab, "Lumped-element Output Networks for High-efficiency Power Amplifiers," MTT Int. Microwave Symposium Anaheim, Calif., May 23-28, 2010, and F. H. Raab, "Class-E -C and F power amplifiers based upon a finite number of harmonics", IEEE Trans. Microwave Theory Tech., vol. 49, no. 8, pp. 1462-1468, August 2001. A design process can utilize the following example waveform coefficients for maximum efficiency and output power capability: $\gamma_v=\gamma_i=1.414$ and $\delta_v=\delta_i=2.912$. The effective supply voltage $V_{eff}$=14.13 V can lead to a $f_0$ component of the drain voltage of $V_{1m}=\gamma_v \cdot V_{eff}=19.98$ V and an output voltage of $V_{om}=V_{1m}/\rho=14.13$ V, where $\rho=|Z_1|/R1=1.414$. Selecting a peak drain current $i_{Dmax}=3.352$ A, the DC input current is $I_{DC}=i_{Dmax}/\delta_i=1.151$ A, and the $f_0$ component of the drain current is $I_{1m}=I_{om}=\gamma_v \cdot I_{DC}=1.627$ A. As a result, the output power is $P_0=(V_{om}I_{om})/2=11.5$ W, with a DC input power $P_{in}=V_{DD} \cdot I_{DC}=17.265$ W. The efficiency for the class-$E_2$ PA in such a configuration is therefore approximately 66.6%.

The magnitude of the $f_0$ impedance can be given by $|Z_1|=V_{1m}/I_{1m}=12.28\Omega$, since $\rho=|Z_1|/R_1=1.414$; and the $f_0$ impedance at device drain is therefore $Z_{VD}=Z_1=R_1+jR_1=8.68+j8.68\Omega$, and for the $2f_0$ reactance is $X_2=-j1.414R_1=-j12.28\Omega$. Accordingly, the example output network design in FIG. 1 can include an electrical-length adjustment network, a $2f_0$ resonator, and an $f_0$ impedance matching network.

Multi-Harmonic Approximation to Class-E Operation

Multi-harmonic approximation to class-E operation can be based upon the classic equations as described herein. An optimum drain impedance, $Z_{VD}$, of a true-transient ideal class-E PA typically requires a series load reactance of $(1+j1.15) R_0$ and a drain shunt susceptance of $B_S=0.1836/R_0$. Combining these, the $f_0$ drain impedance is $Z_{VD}=(1.526+j1.106)\cdot R_0$, and for the $n^{th}$ harmonic the optimum reactance is $X_n=-j5.4466 \cdot R_0/n$, as shown in Table 1 for an example load resistance $R_0$=10$\Omega$. One can note the difference between these impedances and those for the class-$E_2$ approximation as described above.

TABLE 1

Drain Impedance ($Z_{VD}$) Comparison

| Frequency | True Class-E | Class-$E_{10}$ | Ratio $E_{10}/E$ |
|---|---|---|---|
| $f_0$ | 15.26 + j11.064 | 15.26 + j11.064 | 1 |
| $2f_0$ | −j27.23 | −j27.23 | 1 |
| $3f_0$ | −j18.155 | −j9.881 | 0.544 |
| $4f_0$ | −j13.616 | −j5.144 | 0.377 |
| $5f_0$ | −j10.893 | −j3.952 | 0.363 |
| $6f_0$ | −j9.038 | −j3.226 | 0.357 |
| $7f_0$ | −j7.781 | −j2.684 | 0.345 |
| $8f_0$ | −j6.778 | −j2.269 | 0.335 |
| $9f_0$ | −j6.052 | −j1.892 | 0.312 |
| $10f_0$ | −j5.420 | −j1.378 | 0.254 |

The example design is based on a finite number of harmonics assuming up to ten harmonics at $Z_{VD}$ which are typically more than needed for practical implementations. Nevertheless, PA parameters such as output power, DC input current, peak drain voltage and current, etc., can be computed using the equations as described herein since ten harmonic components in the drain waveforms appear to be enough for an approximation to a true-transient design as shown next.

Using the example values of $V_{DD}$=15 V, $V_{eff}$=14.13 V, the example load resistance is set to be $R_0$=10Ω for a predicted output power of $P_0$=0.577·$(V_{eff})^2/R_0$=11.52 W. The DC input current is $I_{DC}$=$V_{DD}$/(1.73·$R_0$)=0.867 A to yield a DC input power of $P_{DC}$=13 W. Therefore, the efficiency is 88.4%. The $f_0$ impedance and optimum reactance magnitudes to be presented as $Z_{VD}$ are summarized in Table 1.

Output Network Design and Multi-harmonic Control: In order to keep the design parameters valid, the output network can be configured to present the required or selected impedance and reactances at $Z_{VD}$ to as many harmonics as possible without an inconvenient single resonator and adjustment network at each harmonic frequency. For example, from PA output to device drain, the loading network can include: (a) a $f_0$ matching network; (b) a broadband harmonic trap; and (c) a parallel LC series resonator dipole. Examples related to such components, as well as a combination of such components, are described herein in greater detail.

In some implementations, an advantage of a broadband bandstop network used as a harmonic trap can include, for example, wider harmonic suppression than a single transmission-line or LC resonator.

Figure 2A:
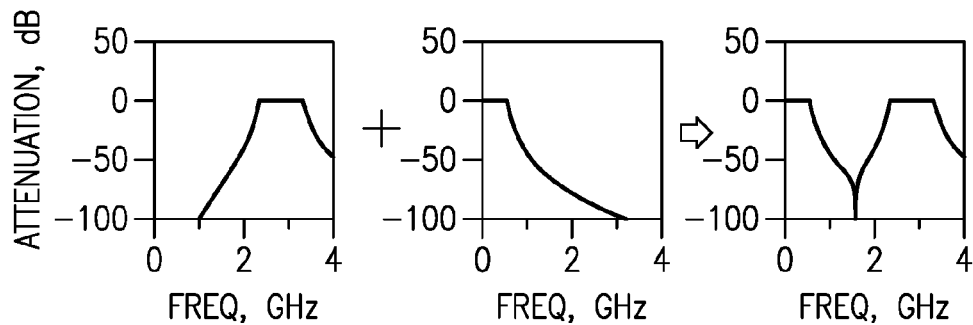
FIG. 2A shows attenuation profiles related to an example UHF broadband harmonic trap.

In some implementations, an example network can be based upon lumped-elements to operate at the lower UHF band since the example PA $f_0$ is 400 MHz. An example of such network response is shown in FIG. 2A. A single quarter-wavelength transmission-line or LC resonator can present maximum or increased attenuation at a single frequency between the edges of the attenuation band.

Figure 2B:
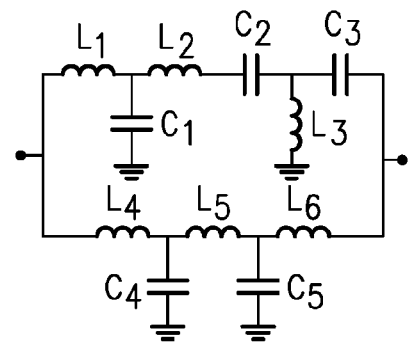
FIG. 2B shows an example circuit that can function as the harmonic trap of FIG. 2A.

In some implementations, attenuation band and notch depth can depend upon the number of resonators and Q (quality factor). FIG. 2B shows that in some embodiments, a broadband notch response can be accomplished by connecting a bandpass and a lowpass network in parallel. In the example of FIG. 2B, an example bandpass network is depicted as including inductances and capacitances L1, L2, C2, C3 arranged in series between an input and an output. A node between L1 and L2 is shown to be coupled to ground by a capacitance C1. A node between C2 and C3 is shown to be coupled to ground by an inductance L3. Also in FIG. 2B, an example lowpass network is depicted as including inductances L4, L5, L6 arranged in series between the input and the output so as to be parallel with the foregoing arrangement of L1, L2, C2, C3. A node between L4 and L 5 is shown to be coupled to ground by a capacitance C4. A node between L5 and L6 is shown to be coupled to ground by a capacitance C5. In some embodiments, these types of example structures can be implemented where resonator Q is not a concern.

In order to serve as broadband harmonic trap for the example 400 MHz $f_0$ PA, an example 3-dB cutoff frequency of the lowpass filter can be set in between the PA $f_0$ and $2f_0$, allowing $2f_0$ attenuation (e.g., FIG. 2A). Meanwhile, the lower 3-dB cutoff frequency of the bandpass filter can be set so that the filter attenuates the highest possible harmonic (e.g., FIG. 2A).

Figure 3:
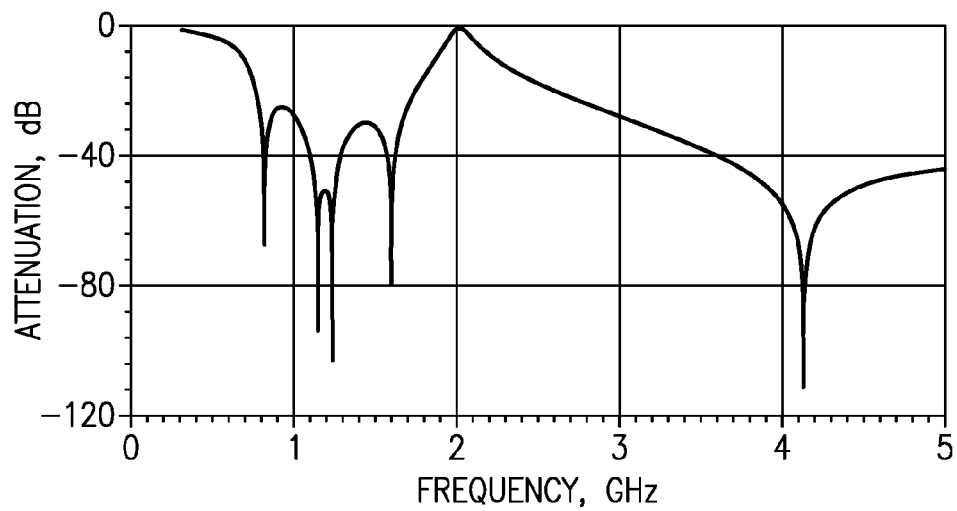
FIG. 3 shows an example of broadband trap attenuation characteristics.

The attenuation slope can be a function of filter order (number of sections). However, when the input signal is coupled through a bandpass and a lowpass filter to the output, the combination of these two filters can produce a broadband attenuation depth response as shown in FIG. 3 using fewer independent filter sections. The example network having a five-section lowpass filter and a wideband bandpass filter is shown in FIG. 2B.

The example network of FIG. 2B can effectively suppress the second, third, and fourth harmonics ($2f_0$, $3f_0$, and $4f_0$). In some embodiments, a dipole network can be configured to adjust the harmonic reactances shorted by the harmonic trap. Such functionality can be accomplished by, for example, a parallel LC series network which provides the required or desired reactance/phase-shift to produce the desired impedance at $Z_{VD}$. Examples related to such a dipole network are described herein in reference to FIG. 4. Design equations associate with the dipole network can be found in, for example, Zverev, A. I. "Handbook of filters synthesis". John Wiley, New York, 1967. In some embodiments, the dipole network's equivalent reactance at a given harmonic frequency can be specified so that the $Z_{VD}$ reactance is adjusted as shown in Table 1.

Figure 4:
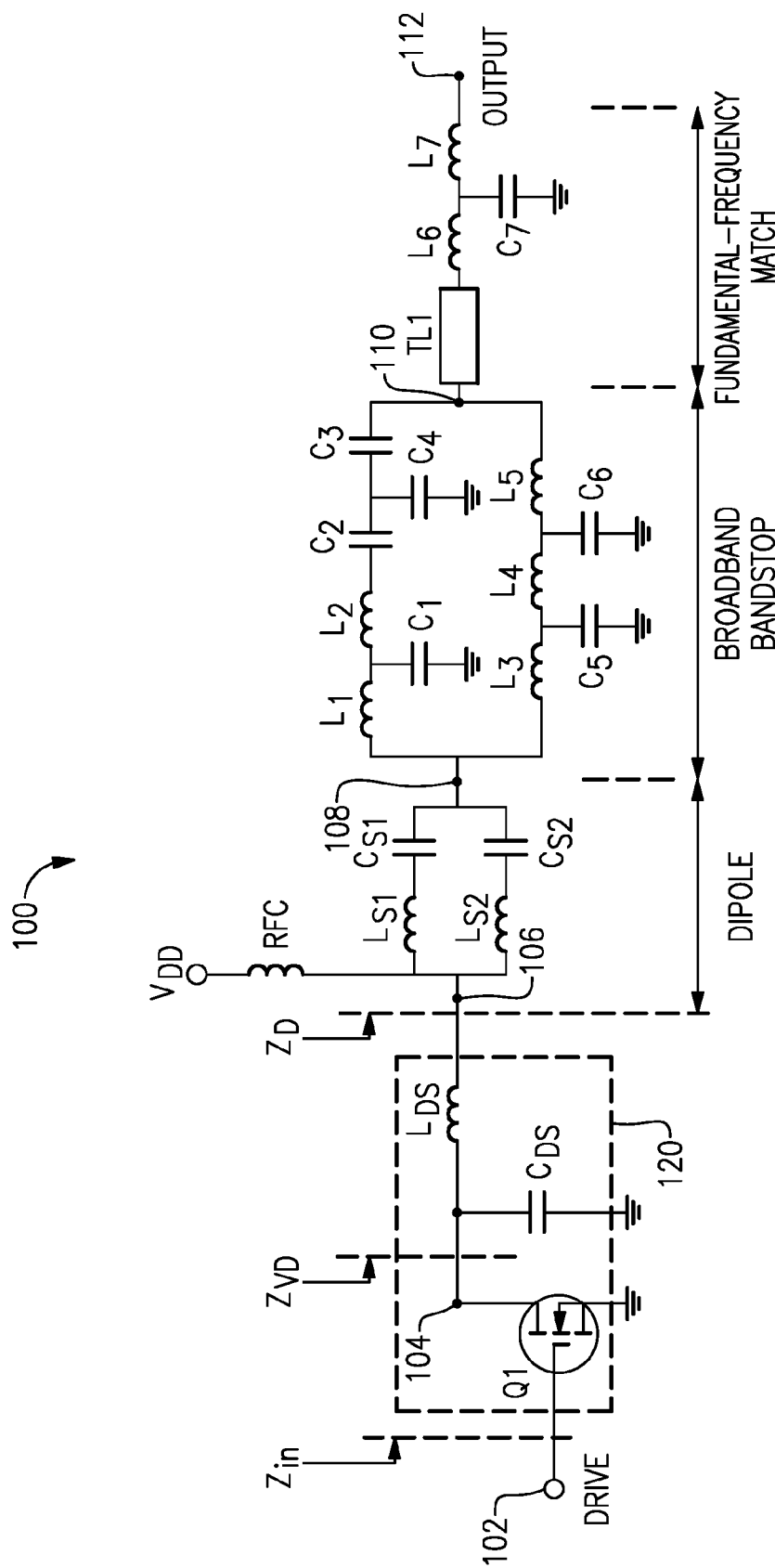
FIG. 4 shows an example configuration of a class-$E_{10}$ PA having one or more features as described herein.

FIG. 4 shows an example configuration of a class-E10 PA 100 having one or more features as described herein. The PA 100 is shown to have an input node 102 and an output node 112. In the example of FIG. 4, the portion of the PA 100 between the input node 102 and node 106 can be similar to the example described herein in reference to FIG. 1B. However, it will be understood that the values of inductance $L_{DS}$ and capacitance $C_{DS}$ in the example of FIG. 4 may or may not be the same as those of FIG. 1B, for a given operating frequency.

In some embodiments, a portion 120 of the PA 100 can be implemented in a package device such as a semiconductor die. In other embodiments, a semiconductor die can include more or less components that the example portion 120. In some embodiments, some or all of the components of the PA 100 can be implemented as a packaged module such as a PA module (PAM).

In the example of FIG. 4, the output of the portion similar to the tuned class-E PA (of FIG. 1B) at node 106 is shown to be coupled to a supply voltage $V_{DD}$ through an RF choke. Further, a pathway between node 106 and the output node 112 is shown to include a dipole section between nodes 106 and 108, a broadband bandstop section between nodes 108 and 110, and a fundamental-frequency match section between nodes 110 and 112.

The dipole section is shown to include two LC circuits connected in parallel between nodes 106 and 108 The first LC circuit is shown to include an inductance $L_{S1}$ and a capacitance $C_{S1}$. The second LC circuit is shown to include an inductance $L_{S2}$ and a capacitance $C_{S2}$.

The broadband bandstop section can include parallel combination of a bandpass network and a lowpass network between nodes 108 and 110. More particularly, the bandpass network can include inductances and capacitances $L_1$, $L_2$, $C_2$, $C_3$ arranged in series between nodes 108 and 110. A node between $L_1$ and $L_2$ is shown to be coupled to ground by a capacitance $C_1$. A node between $C_2$ and $C_3$ is shown to be coupled to ground by a capacitance $C_4$. The lowpass network can include inductances $L_3$, $L_4$, $L_5$ arranged in series between nodes 108 and 110 so as to be parallel with the foregoing arrangement of $L_1$, $L_2$, $C_2$, $C_3$ of the bandpass network. A node between $L_3$ and $L_4$ is shown to be coupled to ground by a capacitance $C_5$. A node between $L_4$ and $L_5$ is shown to be coupled to ground by a capacitance $C_6$.

The fundamental-frequency match section can include a transmission line element $T_{L1}$, an inductance $L_6$, and an inductance $L_7$ arranged in series between nodes 110 and 112. A node between $L_6$ and $L_7$ is shown to be coupled to ground by a capacitance $C_7$.

In some embodiments, the dipole section between nodes 106 and 108 can be configured to control and/or tune reactances presented at the drain node 104 resulting from trapping of as many harmonics as possible or as desired. It will be understood that the configuration of the dipole section shown in FIG. 4 is an example; and that other dipole configurations can also be implemented. For example, a capacitance can be connected in series with a parallel combination of capacitance and inductance, between nodes 106 and 108. In another example, an inductance can be connected in series with a parallel combination of capacitance and inductance, between nodes 106 and 108. In yet another example, a parallel combination of a first path with inductance and capacitance (in series) and a second path with a capacitance can be implemented between nodes 106 and 108. In yet another example, a parallel combination of a first path with inductance and capacitance (in series) and a second path with an inductance can be implemented between nodes 106 and 108. n yet another example, a parallel combination of a first path with inductance and capacitance (in series) and a second path with a capacitance can be implemented in series with a capacitance between nodes 106 and 108.

In some embodiments, the fundamental-frequency match section can be implemented by the transmission-line element $T_{L1}$ and T-network ($L_6$, $L_7$ and $C_7$) as shown in FIG. 4. As a result, the class-$E_{10}$ PA loading network can provide an optimum or desired reactance at the second harmonic $2f_0$, ½ of the optimum reactance to the third and fourth harmonics $3f_0$ and $4f_0$, and approximately ⅓ of the optimum reactance from the fifth harmonic $5f_0$, to the tenth harmonic $10f_0$ as compared to those for a true class-E PA as shown in Table 1.

Figure 5:
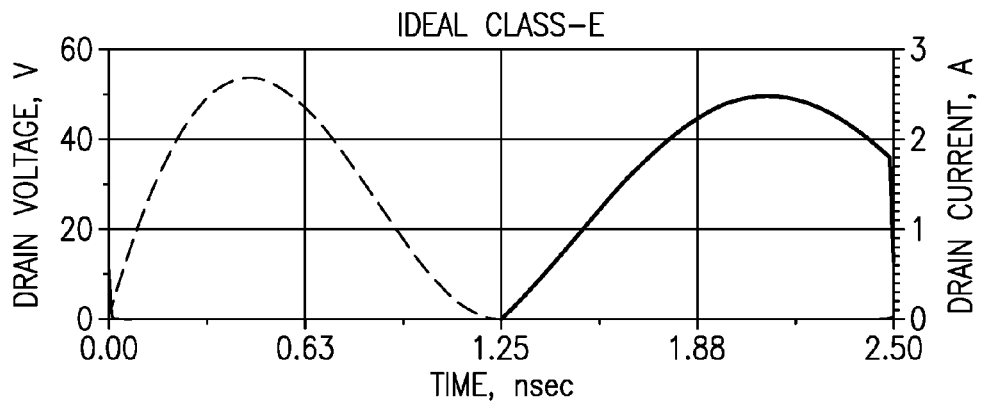
FIG. 5 shows examples of drain voltage and drain current waveforms for the ideal class-E PA.
Figure 6:
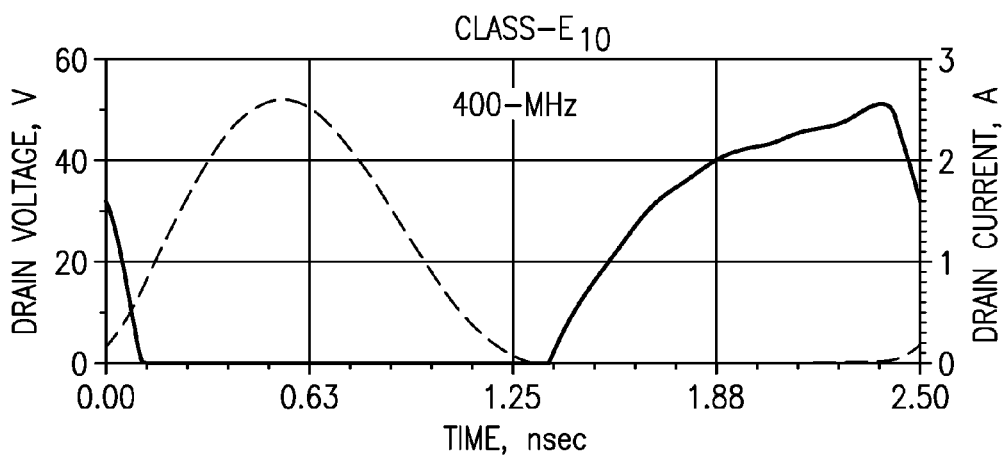
FIG. 6 shows examples of drain voltage and drain current waveforms for the class-$E_{10}$ PA.

FIG. 5 shows examples of drain voltage and drain current waveforms for the ideal class-E PA of FIG. 1A. FIG. 6 shows examples of drain voltage and drain current waveforms for the class-$E_{10}$ PA of FIG. 4. The simulated intrinsic drain waveforms of FIG. 6 resemble those of an ideal class-E PA as shown in FIG. 5. The example output power and efficiency are 11.58 W and 90.3%, respectively, for an ideal device, in agreement with the predicted performance described in the previous section.

Class-$E_{10}$ PA Prototype Performance: A prototype of a class-$E_{10}$ PA similar to the example of FIG. 4 was fabricated, and its performance was evaluated. In the prototype class-$E_{10}$ PA, an input matching network having an LCLC network and stabilization resistances, and such an input matching network was tuned for the example frequency of $f_0$=400 MHz. In the example input matching network, air core inductors and trimmer capacitors were utilized. However, it will be understood that other types of inductances and/or capacitances can also be implemented. Similarly, air core inductors and high-Q trimmers utilized in the prototype's output network were tuned for the expected output power and target drain efficiency. It will be also be understood that other types of inductances and/or capacitances can also be implemented.

In some implementations, the broadband bandstop network of FIG. 4 can be tuned to give similar response as shown in FIG. 3 by tuning the lowpass and bandpass sections individually at first, then, the whole broadband bandstop network can be re-tuned in, for example, a 50 Ω system taking care to minimize or reduce the insertion loss at $f_0$ and making sure the harmonics are laid within the attenuation band. Then, the dipole network adjustment (e.g., $L_{S1}C_{S1}$ and $L_{S2}C_{S2}$) can be important when optimizing for best or improved efficiency which can be tuning process with the $f_0$ matching section in order to obtain the predicted performance.

Figure 7:
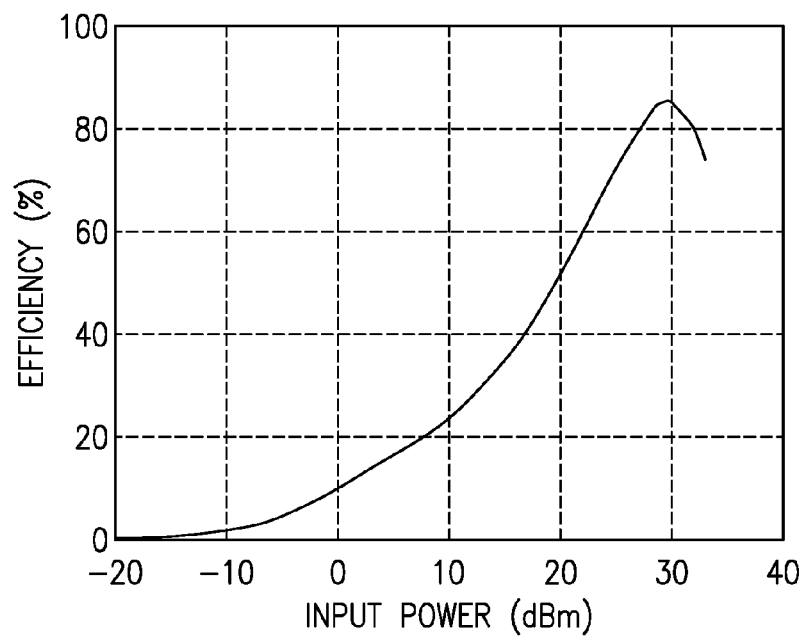
FIG. 7 shows an example of a measured drain efficiency plot for the class-$E_{10}$ PA.
Figure 8:
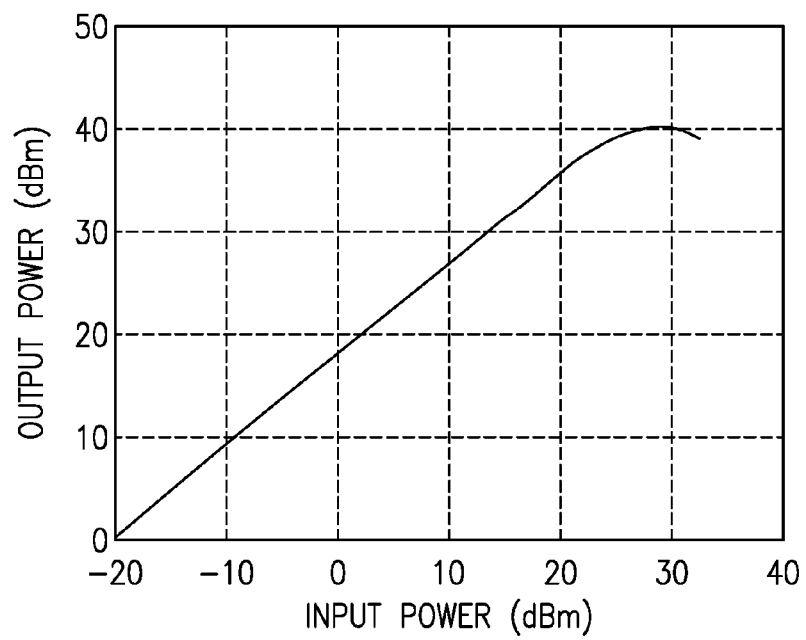
FIG. 8 shows an example of a measured output power plot for the class-$E_{10}$ PA.

FIG. 7 shows an example of a measured drain efficiency plot for the foregoing prototype class-$E_{10}$ PA. FIG. 8 shows an example of a measured output power plot for the same prototype class-$E_{10}$ PA. One can see that a measured peak drain efficiency of approximately 85% is obtained at a peak output power of approximately 10 W. It is noted that a simplified device model accuracy, impedance variation and/or output network losses (e.g., approximately 0.64 dB) can contribute to such performance results, which are slightly lower than those predicted in the previous section.

As described herein by way of examples, a multi-harmonic approximation to class-E operation based upon classic design equations can be implemented. Simulations indicate that ten harmonics can be presented with negative reactance at $Z_{VD}$, although in practice ten harmonics are more than needed in many applications. The measured efficiency can be higher than that of the class-$E_2$ PA and it can be close to the predicted value using classic equations. In order to keep the classic design equations valid, an output network that controls as many harmonics as possible can be provided. The example broadband harmonic trap described herein can be configured to suppress four harmonics, and the complete output network can present the required or desired impedance at $Z_{VD}$ shaping the waveforms similar to those of a true-transient class-E PA.

In some implementations, a device having one or more features described herein can be included in an RF device such as a wireless device. Such a device and/or a circuit can be implemented directly in the wireless device, in a modular form, or in some combination thereof. In some embodiments, such a wireless device can include, for example, a cellular phone, a smart-phone, a hand-held wireless device with or without phone functionality, a wireless tablet, etc.

Figure 9:
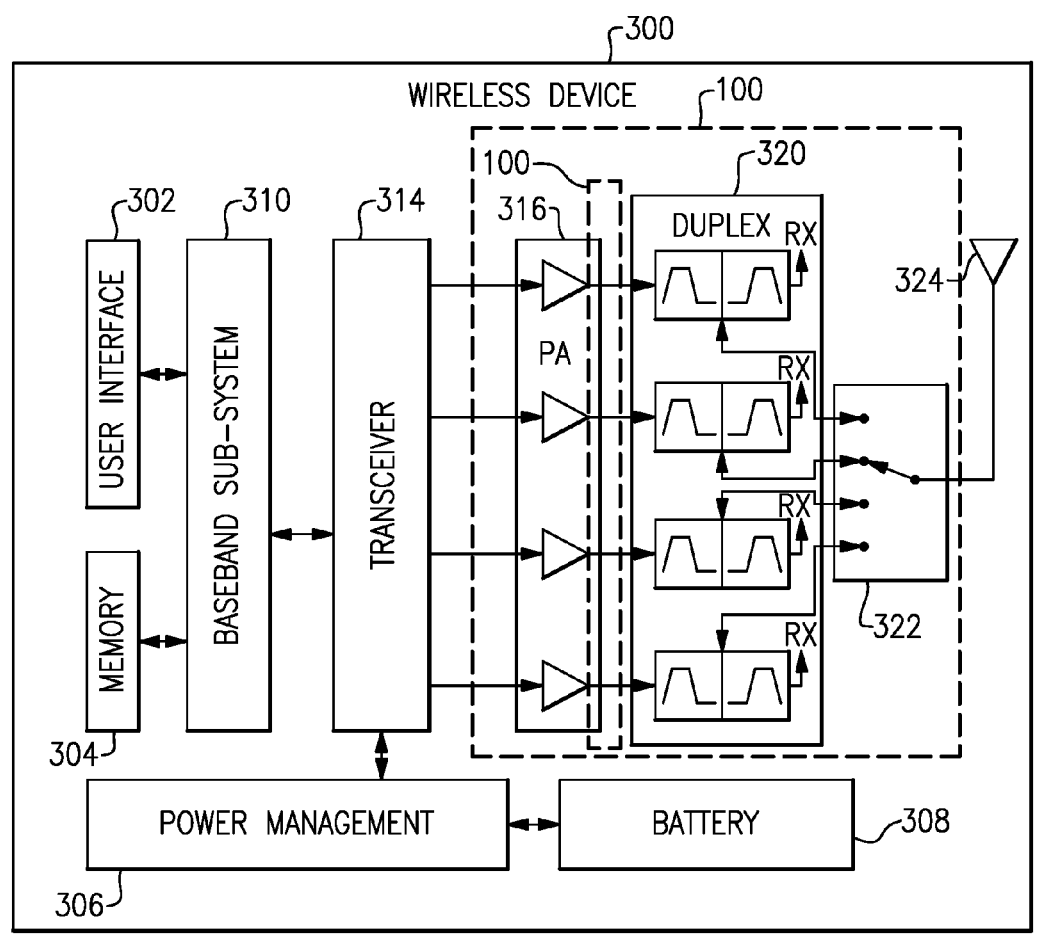
FIG. 9 shows an example of a wireless device having one or more features as described herein.

FIG. 9 schematically depicts an example wireless device 300 having one or more advantageous features described herein. In some embodiments, one or more features of the present disclosure can be implemented in output portions (generally depicted as 100) associated with a power amplifier (PA) module having one or more PAs 316. In some embodiments, one or more features of the present disclosure can be implemented in a power amplifier (PA), also depicted as 100. Some or all circuits and components associated with such a PA can be implemented as, for example, a module.

In the example wireless device 300, the PA module 100 can provide an amplified RF signal to a switch 322 (via a duplexer 320), and the switch 322 can route the amplified RF signal to an antenna 324. The PA module 100 can receive an unamplified RF signal from a transceiver 314 that can be configured and operated in known manners.

The transceiver 314 can also be configured to process received signals. Such received signals can be routed to one or more LNAs (not shown) from the antenna 324, through the duplexer 320.

The transceiver 314 is shown to interact with a baseband sub-system 310 that is configured to provide conversion between data and/or voice signals suitable for a user and RF signals suitable for the transceiver 314. The transceiver 314 is also shown to be connected to a power management component 306 that is configured to manage power for the operation of the wireless device 300.

The baseband sub-system 310 is shown to be connected to a user interface 302 to facilitate various input and output of voice and/or data provided to and received from the user. The baseband sub-system 310 can also be connected to a memory 304 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 10:
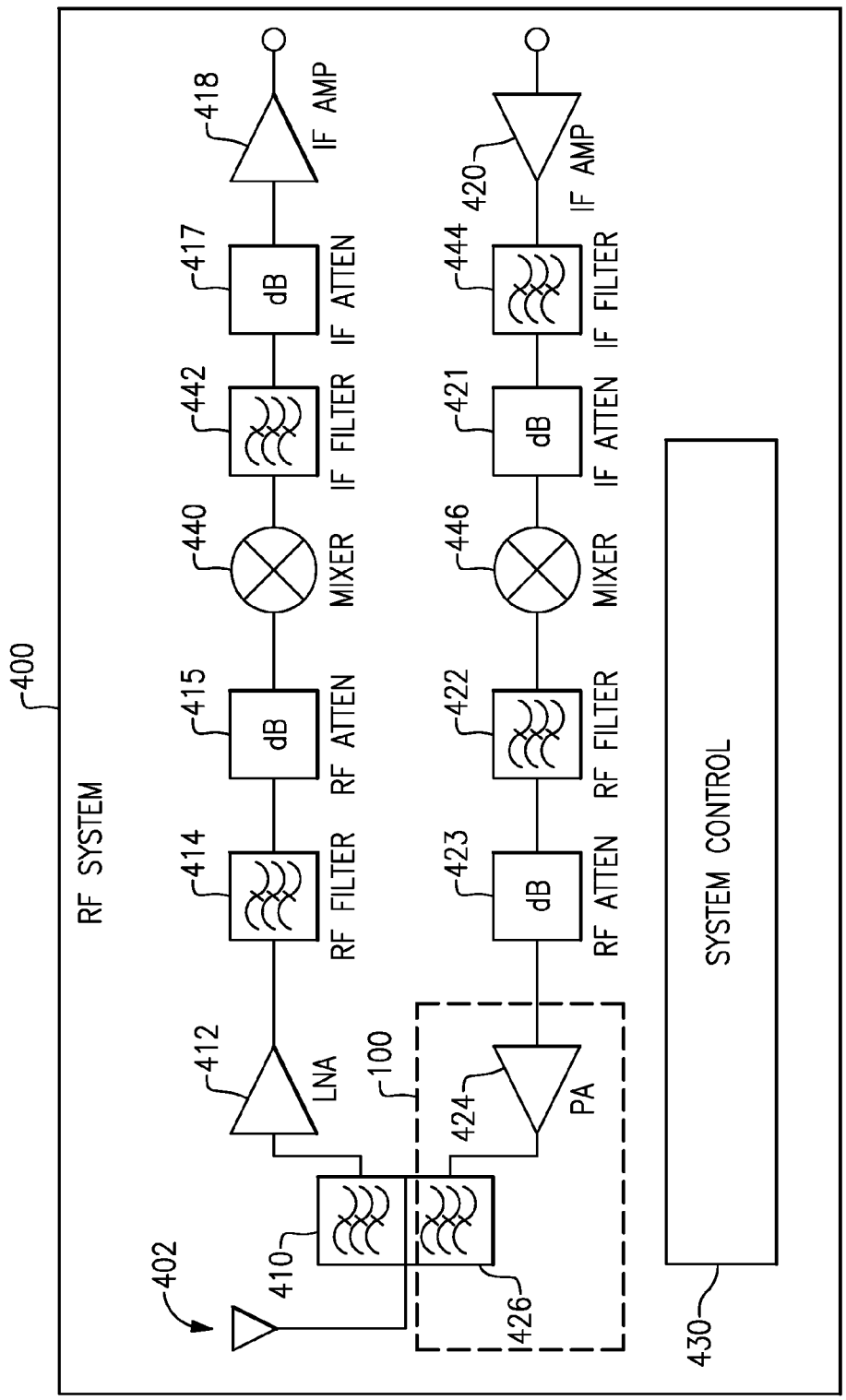
FIG. 10 shows an example of an RF system having one or more features as described herein.

In some embodiments, one or more features of the present disclosure can be implemented in an RF system such as a base station. FIG. 10 shows an example of an RF system 400. Such an RF system can include an antenna 402 configured to facilitate reception and/or transmission of RF signals. In the context of reception, an RF signal received by the antenna 402 can be filtered (e.g., by a band-pass filter 410) before being amplified by a low-noise amplifier (LNA) 412. Such an LNA-amplified RF signal can be filtered (e.g., by a band-pass filter 414), passed through an attenuator 415, and routed to a mixer 440. The mixer 440 can operate with an oscillator (not shown) to yield an intermediate-frequency (IF) signal. Such an IF signal can be filtered (e.g., by a band-pass filter 442) and passed through an attenuator 417 before being routed to an intermediate-frequency (IF) amplifier 418.

In the context of transmission, an IF signal can be provided to an IF amplifier 420. An output of the IF amplifier 420 can be filtered (e.g., by a band-pass filter 444) and passed through an attenuator 421 before being routed to a mixer 446. The mixer 446 can operate with an oscillator (not shown) to yield an RF signal. Such an RF signal can be filtered (e.g., by a band-pass filter 422) and passed through an attenuator 423 before being routed to a power amplifier (PA) 424. The PA-amplified RF signal can be routed to the antenna 402 through a filter (e.g., a band-pass filter 426) for transmission.

In some embodiments, various operations associated with the RF system 400 can be controlled and/or facilitated by a system controller 430. Such a system controller can include, for example, a processor and a storage medium such as a non-transient computer-readable medium (CRM).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An amplifier circuit assembly comprising:
   an amplifier configured to provide a signal at an output;
   a matching network configured to provide impedance matching for the signal having a fundamental frequency;
   a broadband harmonic trap configured to substantially trap a plurality of harmonics associated with the fundamental frequency; and
   a dipole network configured to tune reactances associated with the broadband harmonic trap, the matching network, the broadband harmonic trap and the dipole network implemented in series from the output of the amplifier.

2. The amplifier circuit assembly of claim 1 wherein the amplifier is a power amplifier.

3. The amplifier circuit assembly of claim 2 wherein the power amplifier is a class-E power amplifier.

4. The amplifier circuit assembly of claim 1 wherein the signal includes a radio-frequency signal.

5. The amplifier circuit assembly of claim 1 wherein the series implementation of the matching network, the broadband harmonic trap and the dipole network includes a configuration in which an input of the dipole network is coupled to the output of the amplifier, an input of the broadband harmonic trap is coupled to an output of the dipole network, and an input of the matching network is coupled to an output of the broadband harmonic trap.

6. The amplifier circuit assembly of claim 5 wherein the dipole network includes a parallel combination of a first path and a second path, the first path including a capacitance, the second path including an inductance.

7. The amplifier circuit assembly of claim 6 wherein the first path of the dipole network further includes an inductance in series with the capacitance.

8. The amplifier circuit assembly of claim 7 wherein the second path of the dipole network further includes a capacitance in series with the inductance.

9. The amplifier circuit assembly of claim 5 wherein the broadband harmonic trap includes a parallel combination of a bandpass network and a lowpass network.

10. The amplifier circuit assembly of claim 9 wherein the bandpass network includes a first inductance, a second inductance, a first capacitance, and a second capacitance connected in series, with a capacitive coupling from a node between the first and second inductances to ground through a third capacitance, and an inductive coupling from a node between the first and second capacitances to ground through a third inductance.

11. The amplifier circuit assembly of claim 10 wherein the lowpass network includes a fourth inductance, a fifth inductance, and a sixth inductance connected in series, with a capacitive coupling from a node between the fourth and fifth inductances to ground through a fourth capacitance, and a capacitive coupling from a node between the fifth and sixth inductances to ground through a fifth capacitance.

12. The amplifier circuit assembly of claim 5 wherein the matching network includes a T-network having first and second inductances connected in series and a capacitance that couples a node between the first and second inductances with ground.

13. The amplifier circuit assembly of claim 5 wherein the broadband harmonic trap and the dipole network are configured to present desired impedance and reactance for multiple harmonics associated with the fundamental frequency.

14. The amplifier circuit assembly circuit of claim 13 wherein the multiple harmonics include frequencies that are twice or higher multiples of the fundamental frequency.

15. The amplifier circuit assembly of claim 14 wherein the multiple harmonics include twice the fundamental frequency to ten times the fundamental frequency.

16. The amplifier circuit assembly of claim 15 wherein the broadband harmonic trap is configured to suppress the harmonics including twice the fundamental frequency, three times the fundamental frequency, and four times the fundamental frequency.

17. The amplifier circuit assembly of claim 16 wherein the dipole network is configured to adjust harmonic reactances shorted by the broadband harmonic trap.

18. An amplifier module comprising:

a packaging substrate configured to receive a plurality of components; and an amplifier circuit assembly implemented on the packaging substrate, the amplifier circuit assembly including an amplifier configured to provide a signal at an output, a matching network configured to provide impedance matching for the signal having a fundamental frequency, a broadband harmonic trap configured to substantially trap a plurality of harmonics associated with the fundamental frequency, and a dipole network configured to tune reactances associated with the broadband harmonic trap, the matching network, the broadband harmonic trap and the dipole network implemented in series from the output of the amplifier.

19. A wireless device comprising:

a transceiver configured to generate a signal;

an amplifier circuit assembly in communication with the transceiver, the amplifier circuit assembly including an amplifier configured to amplify the signal and provide an amplified signal at an output, a matching network configured to provide impedance matching for the amplified signal having a fundamental frequency, a broadband harmonic trap configured to substantially trap a plurality of harmonics associated with the fundamental frequency, and a dipole network configured to tune reactances associated with the broadband harmonic trap, the matching network, the broadband harmonic trap and the dipole network implemented in series from the output of the amplifier; and an antenna in communication with the amplifier circuit and configured to facilitate transmission of the amplified signal.

20. The wireless device of claim 19 wherein the wireless device includes a portable wireless device.

* * * * *